United States Patent [19]

Saito et al.

[11] Patent Number: 4,889,817
[45] Date of Patent: Dec. 26, 1989

[54] METHOD OF MANUFACTURING SCHOTTKY GATE FIELD TRANSISTOR BY ION IMPLANTATION METHOD

[75] Inventors: Tadashi Saito; Hiroshi Nakamura; Masanori Tsunotani, all of Tokyo, Japan

[73] Assignee: OKI Electric Industry Co., Ltd., Tokyo, Japan

[21] Appl. No.: 132,713

[22] Filed: Dec. 11, 1987

Related U.S. Application Data

[63] Continuation-in-part of Ser. No. 890,656, Jul. 30, 1986, abandoned.

[30] Foreign Application Priority Data

Aug. 8, 1985 [JP] Japan ................................ 60-173172
Aug. 9, 1985 [JP] Japan ................................ 60-174076
Nov. 20, 1985 [JP] Japan ................................ 60-258712

[51] Int. Cl.$^4$ .......................................... H01L 21/265
[52] U.S. Cl. ........................................ 437/22; 437/24; 437/44
[58] Field of Search ............................ 437/24, 44, 22

[56] References Cited

U.S. PATENT DOCUMENTS

| | | | |
|---|---|---|---|
| 4,559,238 | 12/1985 | Bujatti et al. | 437/45 |
| 4,602,965 | 7/1986 | McNally | 148/1.5 |
| 4,701,422 | 10/1987 | Elliott | 437/8 |
| 4,717,685 | 1/1988 | Nakajima | 437/44 |

FOREIGN PATENT DOCUMENTS

| | | | |
|---|---|---|---|
| 56-155531 | 12/1981 | Japan | 437/22 |
| 57-188877 | 11/1982 | Japan | 437/22 |
| 0111373 | 6/1984 | Japan | 437/45 |
| 62-2625 | 1/1987 | Japan | 437/22 |

Primary Examiner—Olik Chaudhuri
Attorney, Agent, or Firm—Wenderoth, Lind & Ponack

[57] ABSTRACT

A method of manufacturing a schottky gate field effect transistor with use of a technique of ion implantation comprises the steps of: (a) selectively implantation an ion into a schottky gate field effect transistor formed in a compound semiconductor substrate and (b) annealing the resultant semiconductor substrate at temperature of from 300° C. to 450° C., whereby threshold voltage and a drain current of the schottky gate field effect transistor can be made prescribed values without deteriorating another characteristics of the transistor.

4 Claims, 3 Drawing Sheets

(a)

(b)

METHOD OF MANUFACTURING SCHOTTKY GATE FIELD TRANSISTOR BY ION IMPLANTATION METHOD

This application is a continuation-in-part of now abandoned application Ser. No. 890,656, filed July 30, 1986 now abandoned.

BACKGROUND OF THE INVENTION

1. Field of the invention

The present invention relates to a method of manufacturing a Schottky gate field effect transistor, and more particularly to a method of adjusting the threshold voltage and the drain current of a Schottky gate field effect transistor formed on a compound semiconductor substrate to desired values by making use of an ion implantation method.

2. Description of the Prior Art

A Schottky gate field effect transistor is well known in general as a MESFET (Metal Semiconductor Field-Effect Transistor) as described for example in IEEE ELECTRON DEVICE LETTERS. vol. EDL-4, No. 4 April 1983, PP 102 to 104 by H. M. LEVY and R. E. LEE.

A MESFET is manufactured by forming a refractory-metal gate electrode which serves to provide a Schottky barrier for the implanting of an impurity ion for use in an active layer into a compound semiconductor substrate and annealing the substrate at a temperature of about 800° C., and furthermore, forming an ohmic electrode of the implanting ion into said refractory-metal gate electrode at temperature of about 800° C. to form an n+ layer. Adjustment of the threshold voltage of such MESFET is effected by changing the amount of implantation of the impurity ion for the active layer described above. Moreover, as disclosed in U.S. Pat. No. 3,912,546, or in U.S. Pat. No. 4,160,984 the threshold voltage, etc., of MESFET is adjusted by implanting an ion into a substrate surface to form crystal defects.

However, it was difficult to form an FET of as desired by use of threshold voltage such prior art semiconductor devices over the whole of the substrate with good reproducibility since there are inevitably produced variations in the characteristics of the compound semiconductor substrates as well as variations in the various conditions thereof in the process of manufacturing. Furthermore, such semiconductor devices, although the threshold voltage of an FET can be measured after forming the usual ohmic electrode, the FET must be heated above beyond 500° C. after the formation of the ohmic electrode, and its characteristics are severly degraded; hence; it is impossible to anneal it at a temperature above 500° C.

In addition, a logical circuit such as an inverter, etc., consists in general of a normally-on type depletion mode FET (hereinafter referred to as D.FET) and of a normally-off type enhancement mode FET (hereinafter referred to as E.FET). Such a D.FET incorporated in the logic circuit is connected at its gate electrode and source electrode with each other and is employed as a constant current source. Here, the saturated drain current (hereinafter referred to as $I_D$) has the following relationship with and the threshold voltage (hereinafter referred to as $V_t$): $I_D = K(V_G - V_T)^2$, where $V_G$ is the gate voltage and K is the proportional constant. Accordingly, in employing the D.FET as a constant current source, the relation: $I_D = K V_T^2$ holds. Here, since K is the proportional constant dependent on the gate length, a gate width the, mobility of the electrons, and the channel thickness, etc., and is typically constant, $I_D$ is controllable in the manufacture of the FET by controlling $V_T$.

However, it is difficult to form the desired $V_T$ in a circuit design for all substrates with good reproducibility as described before, and with the increased $I_D$ of a D.FET for loading, the current consumed is increased resulting in a reduced noise margin sometimes making logical operation impossible.

SUMMARY OF THE INVENTION

In view of the drawbacks of the prior art method of manufacturing an FET, it is an object of the present invention to provide an FET with good reproducibility, such FET being adapted to have the desired threshold voltage by adjusting the threshold voltage of the FET without annealing the same above 500° C.

Further, it is another object of the present invention to adjust the threshold voltage of an FET with good accuracy without sharply reducing a the parameter K which parameter is indicative of the characteristics of the FET.

Still another object of the present invention is to provide a D.FET having its drain current ($I_D$) reduced and its characteristics controlled.

To achieve the above objects, a method of manufacturing a schottky FET according to the present invention comprises the steps of: (a) implanting an inpurity ion, after forming FETs on a plurality of compound semiconductor substrates, into a substrate among the substrates formed as described above having their threshold voltages shifted to be more negative than to the desired values such that the peak concentrations of the implanted ions are brought about to the deeper position than in a peak concentration of the donor ion concentration implanted into the active layer, (b) shifting the threshold of the FET more to the negative side than that of the desired value in a positive direction due to the effect of damages, etc. based on the implanted ions, and further (c) annealing the resultant FET at temperature of from 300° C. to 450° C. Furthermore, the present method comprises the steps of: (d) measuring the drain currents of D.FETs formed on a selected substrate having a D.FET formed thereon, the D.FET providing a higher drain current than the desired drain current, and (e) implanting an ion into part of the current path of the D.FET formed on the selected substrate to form a high resistance region. The above and other objects, features and advantages of the present invention will become more apparent from the following description when taken in conjunction with the accompanying drawings in which a preferred embodiment of the present invention is shown by way of illustrative examples.

DETAILED DESCRIPTION OF THE PREFERRED EMBODIMENT

Figure 1:
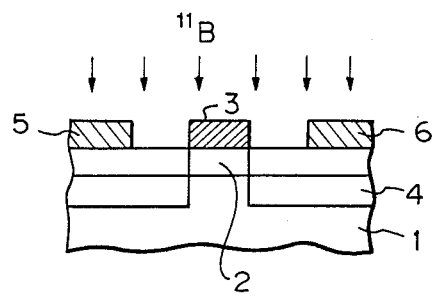
FIG. 1 is a cross sectional view illustrating an embodiment of a MESFET according to the present invention.

The present invention relates to a method of manufacturing field effect transistors by an ion-implantation technique. This method involves two principal embodiments:

(1) The first embodiment for manufacturing field effect transistors by an ion-implantation technique comprises the steps of:

(a) preparing a plurality of compound semiconductor substrates, forming field effect transistors on each of said semiconductor substrates, each of said field effect transistors having an active layer formed by ion-implanting donor ions into said substrate and annealing the same at a temperature of about 800° C., each of said substrates having a source electrode, a drain electrode and a Schottky barrier gate electrode thereon, said source electrode and drain electrode both containing gold and germanium and making ohmic contact with said active layer;

(b) measuring a threshold voltage of said field effect transistors and selecting a substrate in which the threshold voltage of the field effect transistor formed thereon has a value deviating negatively from a predetermined designated voltage; and (c) selectively ion-implanting impurity ions to the amount of less than $1.0 \times 10^{11}$ does/cm$^2$ into said selected substrate to form an impurity ion profile such as to have a concentration peak thereof at a location in the substrate deeper than that of a concentration peak of donor ions in said active layer.

(2) The second principal embodiment for manufacturing field effect transistors by an ion implant technique comprises the steps of:

(a) preparing a plurality of compound semiconductor substrates, each including a normally-on type field effect transistor thereon, said field effect transistor having an active layer formed by ion implanting into said substrate donor ions and annealing the same at a temperature of about 800° C., each of said substrates having a source electrode, a drain electrode and a Schottky barrier gate electrode thereon, said source electrode and drain electrode both containing gold and germanium and making ohmic contact with the active layer;

(b) measuring a drain current of said field effect transistors to select a substrate in which said drain current of a field effect transistor formed thereon has a value greater than a predetermined designated drain current; and (c) forming a high resistant region by ion implanting into a portion of a said normally-on type field effect transistor formed on said selected substrate.

The prominent features of the above embodiments will now be described.

The step (a) of the embodiments (1) and (2), above, is a step of preparing a plurality of compound semiconductor substrates on which the usual Schottky barrier gate FETs (hereinafter referred to simply as MESFET) are formed thereon. The term "usual MESFET" used herein means a transistor which has an active layer formed by implantation of donor ions and annealing such transistor at a temperature of about 800° C., wherein a gate electrode serves as the Schottky barrier for the active layer, and a source/drain electrode is brought into ohmic contact with the active layer and which electrode contains at least gold and germanium. The source/drain electrode used in the practice of the present invention is an ohmic electrode, as stated previously in the present specification, which ohmic electrode cannot be annealed at a temperature beyond 500° C. Moreover, since an ohmic electrode containing AuGe is set forth as the source/drain electrode in U.S. Pat. No. 3,912,546, at col. 5, lines 11–15 and U.S. Pat. No. 4,160,984 at col. 4, lines 33 to 40), both referred to in the "Description of the Prior Art" of the present specification, it should be clear that the source/drain electrode used in the present invention is an ohmic electrode containing AuGe which cannot be annealed at a temperature beyond 500° C.

In step (b) of the embodiments (1) and (2), above, the threshold voltage or drain current of the MESFET is measured in order to select a substrate having a MESFET whose threshold voltage or drain current is, respectively, smaller or larger than a predetermined threshold voltage of drain current.

In step (c) of embodiments (1) and (2), impurity ions are selectively implanted into the selected substrate to form an impurity ion profile, thereby shifting the threshold voltage of the MESFET positively or by forming a high resistance region in the current path.

An embodiment of a method of manufacturing a MESFET according to embodiment (1) of the present invention with use of an ion implantation method will be described with reference to the accompanying drawings.

As shown in FIG. 1, $^{29}$Si is first injected into the surface layer of a GaAs substrate 1 as a compound semiconductor substrate with an injection energy of 60 keV, and the resultant substrate is annealed at temperature of about 850° C., whereby an n type active layer 2 (hereinafter referred to as an n layer) is formed. In succession, a W-Al (Al:1 at %) gate 3 forming a schottky barrier, a high concentration n type conductive layer 4, and a source electrode 5 and a drain electrode 6 providing an ohmic contact are respectively formed using an ordinary method for manufacturing a MESFET. Likewise, a MESFET is manufactured on another GaAs substrate (not shown). Here, the W-Al gate 3 has a film thickness of 1000 Å, a gate length $L_G = 1.0$ μm, and a gate width $W_G = 10$ μm. In succession, after measuring the threshold voltage (hereinafter referred to as $V_T$) of these MESFETs with use of a probe needle, $^{11}$B is implanted into the GaAs substrate 1 including a MESFET having $V_T$ displaced to the more negative side than in a prescribed value at 200 keV of energy, which provides a peak of concentration thereof at a location deeper than a peak of concentration of $^{29}$Si in the n layer 2 beyond, after passing the gate 3. Then, the GaAs substrate so processed is annealed at 380° C. for 5 minutes.

Table 1 shows the characterristics of the MESFT produced as described above by implanting into the GaAs substrate 1, an ion of $^{11}$B with an implantation energy of 200 keV and 100 keV, the peak of the latter providing concentration of $^{11}$B located at a peak position of concentration shallower than the peak position of the concentration of $^{29}$Si in the n layer 2 with a dose of $4 \times 10^9$ dose/cm$^2$, and thereafter annealing the resultant substrate at 380° C. for 5 minutes. In the same table, designated at E is the implantation energy, K, K' are respectively K values before and after the implantation of $^{11}$B, $V_T$, and $V_T$, are the $V_T$ values before and after the implanatation of $^{11}$B, and $\Delta$K is the amount of change of K where $V_T$ is shifted positively by 1 mV.

TABLE 1

| E | $^{11}B$ K | K' | 4 × 10$^9$ dose/cm$^2$ $V_T$ | $V_T$ | $\Delta$K |
|---|---|---|---|---|---|
| 100 | 1546.8 | 1280.3 | −265.9 | −180.7 | 3.13 |
| 200 | 1496.2 | 1462.9 | −246.6 | −3.3 | 0.137 |

Unit E: [keV]
K, K': [μA/V$^2$],
$V_T$, $V_T$: [mV]
$\Delta$K: [μA/V$^2$]  (changes of K values per positive 1 mV shift of $V_T$)

As evidenced from Table 1, with the implantation energy of 100 keV, the decrement of the K value is 3.13 [μA/V$^2$] when $V_T$ is positively shifted by 1 mV, while with 200 keV, it is 0.137 [μA/V$^2$]. By increasing the implantation energy such that the concentration peak is located at the deeper position than that of a peak position of $^{29}$Si concentration in the n layer, the decrement of the K value can greatly be reduced.

Table 2 shows the same parameters when $^{12}$C having a larger mass number than that of $^{11}$B is implanted, instead of $^{11}$B. The implantation energy is 200 keV, the amount of implantation is 4×10$^9$ dose/cm$^2$, K and K' are respectively the K values before and after the implantation of $^{12}$C, $V_T$ and $V_T$ are $V_T$ values before and after the implantation of $^{12}$C, and $\Delta$K is the amount of change of the K value when $V_T$ is positively shifted by 1 mV.

TABLE 2

| E | $^{12}C$ K | K' | 4 × 10$^9$ dose/cm$^2$ $V_T$ | $V_T$ | $\Delta$K |
|---|---|---|---|---|---|
| 200 | 1525.2 | 1130.8 | −289.3 | −208.6 | 4.89 |

Unit E: [keV]
K, K': [μA/V$^2$],
$V_T$, $V_T$: [mV]
$\Delta$K: [μA/V$^2$]  (changes of K values per positive 1 mV shift of $V_T$)

As clearly shown from a comparison of the values of the Tables 1 and 2, with the implantation energies being equal and with the amounts of implantation being likewise equal in both the Tables, the decrement of the K value is more reduced in the case of $^{11}$B, which has a smaller mass number. Namely, an implanted ion of a smaller mass number serves to an even greater extent reduce the decrement of the K value.

Furthermore, Table 3 shows the peak positions of the $^{11}$B concentration with respect to the thicknesses of a gate film when $^{11}$B is implanted with an implantation energy of 200 keV and with an amount of implantation of $^{11}$B of 4×10$^9$ dose/cm$^2$.

TABLE 3

| t | $^{11}B$ d | 4 × 10$^9$ dose/cm$^2$ D |
|---|---|---|
| 1000 | 1400 | 500 |
| 2000 | 0 | 500 | t: thickness of gate film in the unit of Å
d: depth of concentration peak of $^{11}$B from the surface of the GaAs substrate in the unit of Å
D: depth of concentration peak of $^{29}$Si from the surface of the GaAs substrate in the unit of Å

As shown in Table 3 with a gate film thickness of 1000 Å, the peak position of concentration is located at a depth of 1400 Å from the surface of the GaAs substrate i.e., deeper than that of $^{29}$Si in the n layer, while, with a gate film thickness of 2000 Å, the peak position of concentration of $^{11}$B is located at the surface of the GaAs substrate. As a result, as the gate film thickness is increased, the peak position of concentration of $^{11}$B is located in a position from the surface of the GaAs substrate, thus resulting in a more reduced K value.

Figure 2:
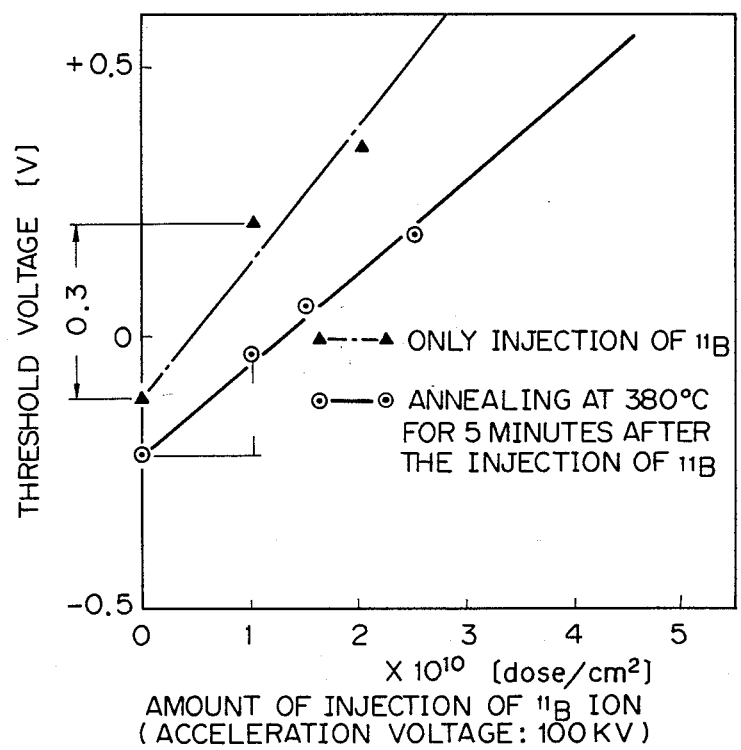
FIG. 2 is a graph showing the relationship between the amount of implantation of a boron ion and the threshold voltage $V_T$.
Figure 3:
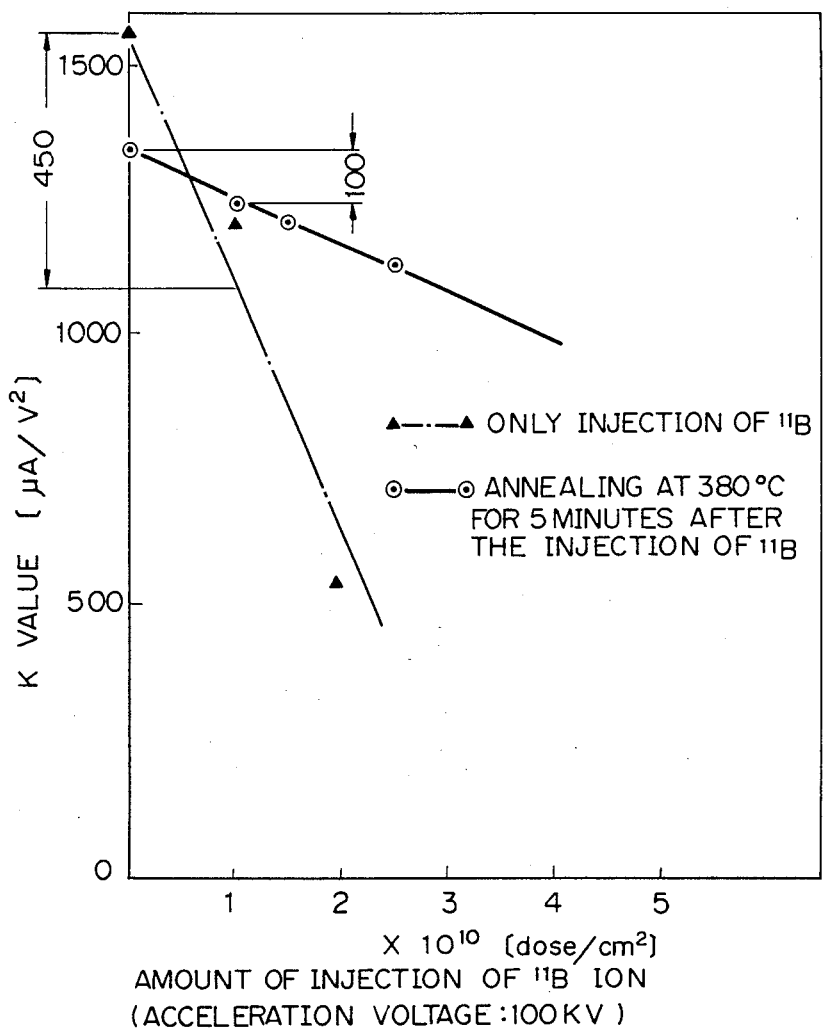
FIG. 3 is a graph illustrating the changes of the K previously described, versus the amount of implantation of the boron ion.

In succession, FIG. 2 is a graph illustrating the differences between two cases: one with only the implantation of $^{11}$B being repeated, and the other in which the substrate has been annealed at 380° C. for 5 minutes after the implantation of $^{11}$B, assuming that the amount of ion implantation is located on the horizontal axis and the threshold voltage $V_T$ on the vertical axis. As shown in the figure, with a dose of only $^{11}$B implantaton of 1.0×10$^{10}$ dose/cm$^2$, the threshold voltage $V_T$ can be adjusted positively by about 0.3 V, while the one which has been annealed at 380° C. for 5 minutes after the $^{11}$B implantation, $V_T$ can be shifted positively by about 0.2 V. In addition, it is recognized that the case in which the substrate has been annealed at 380° C. for 5 minutes after the $^{11}$B implantation, there is less of a deviation from linearing between the amount of ion implantation and the threshold voltage, as compared with the case when only of $^{11}$B is implanted into the substrate. FIG. 3 further shows the changes of the K value. With only an implantation of $^{11}$B at the dose of 1.0×10$^{10}$ dose/cm$^2$, the K value is reduced by about 450 [μA/V$^2$], where as with the case of the annealing at 380° C. for 5 minutes, the decrement of the K value is only about 100 [μA/V$^2$]. Accordingly, it is possible to positively shift the threshold voltage in response to the amount of ion implantation without reducing the K value by annealing the substrate at 380° C. for 5 minutes. Thus, an FET having a desired threshold voltage can be yielded.

Moreover, another method may be employed in the process before the formation of the FET. In addition, although in the present embodiment a GaAs substrate 1 was employed as the substrate and $^{11}$B employed as the impurity ion to be injected, any compound semiconductor substrate may be employed and there is not any particular limitation in respect to the impurity ion, providing is employed which is capable of at least passing through the gate electrode and which has a mass number less than 80. And, for the amount of ion implantation, an amount less than 1.0×10$^{11}$ dose/cm$^2$ may be proper, providing it incapable of elevating the current path resistance.

Here, another embodiment (2) of the method of manufacturing an FET according to the present invention will be described with reference to FIGS. 4(a) and (b).

Figure 4:
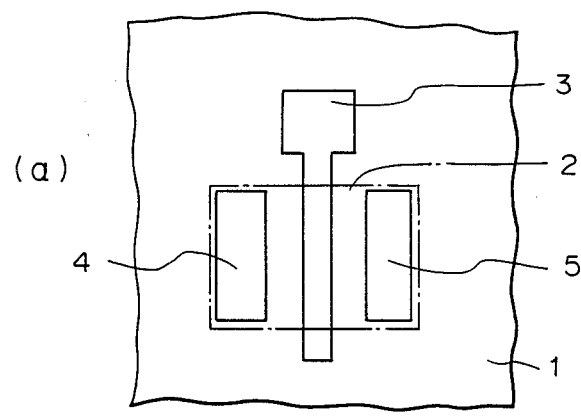
FIGS. 4(a), (b) are respectively plan views of a MESFET illustrating another embodiment of the present invention.
Figure 4:
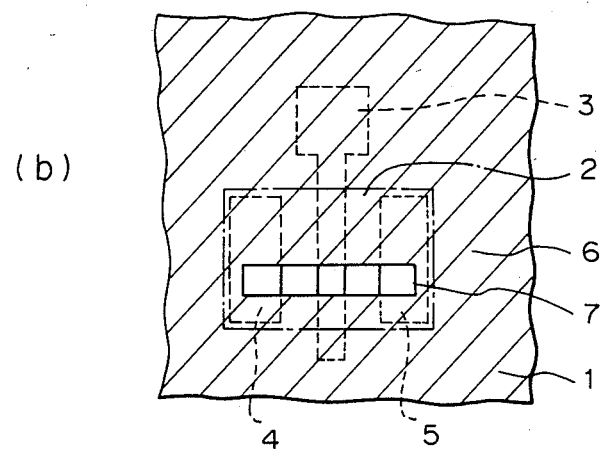

As shown in FIG. 4(a), a D.FET is produced by a conventional method with the n type conductive layer 2 being a current path formed by implanting a doner ion into a GaAs substrate and annealing the resultant substrate, the gate electrode 3 providing a schottky barrier, and the source electrode 5 and the drain electrode 6 providing an ohmic contact are formed. Likewise, a plurality of D.FETs are respectively formed on another GaAs substrate (not Shown).

Then, a drain current of a prescribed D.FET formed on the GaAs substrate 1 is measured with use of a probe needle, etc., whereby a GaAs substrate 1 having a D.FET exhibiting a drain current higher than a desired drain current is selected.

In succession, as shown in FIG. 4(b), a resist 7 is deposited on the surface of the selected GaAs substrate 1, and an opening 8 is formed by removing in part the resist 7 on an n type conductive layer 2 by making use of lithography, Then, $^{12}C$ is implanted into part of the n type conductive layer 2, under such conditions of implantation energy of 160 keV and the amount of implantation of $2.5\times10^{11}$ dose/cm$^2$, and part is the n type conductive layer 2 before the opening 8 is made to have a high resistance by making use of the effects of damage of the implanted ion, etc. to remove the resist 7. According to the present embodiment of the invention, only the drain current can be reduced by a ratio of the opening 7 to the gate width, without changing other characteristics of the FET.

With the present invention, as described above, when the threshold voltage is negatively shifted from its target value, the threshold voltage can be approached to its target value, without sharply reducing the K value, by positively shifting the threshold voltage even after completing the FET structure. Thus, accordingly to the present invention, an FET having desired characteristic can be assured in a process of forming the FET, even if the threshold voltage is negatively shifted.

Furthermore, according to the present invention, part of the current path is made to be highly resistant without deteriorating the D.FET characteristics other than the drain current after forming the D.FET, whereby the drain current can be reached by the ratio of a region made highly resistant to the current path. Thus, even with the high drain current in the step of forming the D.FET, an FET of desired characteristics can be assured by making use of the method according to the present invention.

Although certain preferred embodiments have been shown and described, it should be understood that many changes and modifications may be made therein without departing from the scope of the appended claims.

What is claimed is:

1. A method of manufacturing field effect transistors by an ion-implantation technique comprising the steps of:
   (a) preparing a plurality of compound semiconductor substrates, forming field effect transistors on each of said semiconductor substrates, each of said field effect transistors having an active layer formed by ion-implanting donor ions into said substrate and annealing the same at a temperature of about 800° C., each of said substrates having a source electrode, a drain electrode and a Schottky barrier gate electrode thereon, said source electrode and drain electrode both containing gold and germanium and making ohmic contact with said active layer;
   (b) measuring a threshold voltage of said field effect transistors and selecting a substrate in which the threshold voltage of the field effect transistor formed thereon has a value deviating negatively from a predetermined designated voltage; and
   (c) selectively ion-implanting impurity ions, which damage the substrate by causing crytal defects therein, in an amount of less than $1.0\times10^{11}$ dose/cm$^2$ into said selected substrate to form an impurity ion profile such as to have a concentration peak thereof at a location in the substrate deeper than that of a concentration peak of donor ions in said active layer.

2. A method of manufacturing a field effect transistor with use of the technique of ion implantation according to claim 1, wherein said method includes a process of annealing said substrate at temperature of from 300° C. to 450° C. after the implantation of said impurity.

3. A method of manufacturing a field effect transistor with use of the technique of ion implantation according to claim 1, wherein said impurity is less than 80 in its mass number.

4. A method of manufacturing a field effect transistor with use of the technique of ion implantation according to claim 3, wherein said impurity is boron.

* * * * *